(12) United States Patent
Park et al.

(10) Patent No.: US 7,465,524 B2
(45) Date of Patent: Dec. 16, 2008

(54) PHOTOMASK AND METHOD OF CONTROLLING TRANSMITTANCE AND PHASE OF LIGHT USING THE PHOTOMASK

(75) Inventors: Jin-hong Park, Seoul (KR); Seong-woon Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 735 days.

(21) Appl. No.: 11/019,475

(22) Filed: Dec. 23, 2004

(65) Prior Publication Data

US 2005/0158636 A1    Jul. 21, 2005

(30) Foreign Application Priority Data

Jan. 20, 2004    (KR) .................. 10-2004-004419

(51) Int. Cl.
*G03F 1/00* (2006.01)

(52) U.S. Cl. ........................................... 430/5

(58) Field of Classification Search ............... 430/5, 430/22; 428/430, 428; 378/35
See application file for complete search history.

(56) References Cited

U.S. PATENT DOCUMENTS 6,379,868 B1 * 4/2002 White .................. 430/311
2003/0230816 A1 * 12/2003 Kappe et al. ............ 257/922

FOREIGN PATENT DOCUMENTS

| KR | P1997-0016787 | 4/1997 |
| KR | 100161389 B1 | 8/1998 |
| KR | 1020030067039 A | 8/2003 |

* cited by examiner

*Primary Examiner*—Stephen Rosasco
(74) *Attorney, Agent, or Firm*—Volentine & Whitt, PLLC

(57) ABSTRACT

A photomask and a method of controlling a transmittance and phase of light using the photomask are disclosed. The photomask comprises a transparent substrate, and a plurality of lattices formed on the back face of the transparent substrate. The plurality of lattices are binary lattices, each having a duty ratio and a tilt angle. The duty ratio and tilt angle are controlled together in order to simultaneously control transmittance and phase of light transmitted through the photomask.

19 Claims, 10 Drawing Sheets

PHOTOMASK AND METHOD OF CONTROLLING TRANSMITTANCE AND PHASE OF LIGHT USING THE PHOTOMASK

BACKGROUND OF THE INVENTION

1. Field of the Invention

The present invention relates generally to a photomask and a method of controlling the transmittance and phase of light using the photomask. More particularly, the present invention relates to a photomask controlling the transmittance and phase of light using lattice structures wherein a pitch is shorter than a wavelength of the light.

A claim of priority is made to Korean Patent Application No. 2004-4419, filed Jan. 20, 2004, the disclosure of which is incorporated herein by reference in its entirety.

2. Description of the Related Art

High resolution photolithography is generally used in manufacturing highly integrated semiconductor integrated circuits. The efficacy of high resolution photolithography is limited, however, by a mask error enhancement factor (MEEF). Since a photolithography process used to etch a wafer generally requires a critical dimension (CD) distribution that cannot be provided by a conventional photomask due to a prohibitively large MEEF, a photolithography process having a small MEEF is desired.

Many studies have been conducted in order to develop a photolithography process having a small MEEF. In particular, studies have been conducted in order to develop a photolithography process having increased resolution and depth of focus, thus enabling patterns having higher precision to be formed on a wafer. For example, according to one method, increased resolution and depth of focus are attained by forming a lattice structure on a back face of a photomask. According to this method, several methods are employed to achieve a modified illumination effect such as dipole or quadrupole illumination.

Korean Patent Application No. 2003-0067039 discloses a photomask by which a modified illumination effect is obtained using off-axis illumination. Off-axis illumination is obtained by forming a regular and periodic phase lattice on the back face of the photomask. Although modified illumination is obtained by forming the lattice structure on the back face of the photomask, this method fails to control the phase and transmittance.

In order to improve wafer shot uniformity, a different method controls transmittance by minimizing light from zero-order diffraction. Light from zero-order diffraction is minimized by forming lattices on the back face of the photomask and by controlling the density of the lattices. This method, however, only controls the transmittance of light and not the phase. Therefore, when transcribing a complicated variety of patterns on a wafer using an exposure process, pattern defects often occur due to transmittance distribution.

It is advantageous to use a multiphase diffraction optical element instead of a binary phase diffraction optical element to obtain a modified illumination effect because the multiphase diffraction optical element obtains a higher efficiency of images. A method of forming a multiphase diffraction optical element typically comprises forming a stair-shaped structure on the back face of a photomask. However, noise is caused due to limited diffraction efficiency, which has a negative effect on the formation of patterns on a wafer. Accordingly, a photomask capable of removing noise by controlling the transmittance, and also capable of forming a multiphase diffraction optical element is needed.

SUMMARY OF THE INVENTION

The present invention provides a photomask capable of improving a CD distribution by controlling transmittance. A modified illumination effect is obtained for a photolithography process with respect to both the transmittance and phase of light.

The present invention also provides a method of controlling transmittance and phase of light, thereby improving CD distribution using a lattice structure on the back face of a photomask. The lattice structure of the present invention forms a multiphase diffraction optical element.

According to one aspect of the present invention, there is provided. The photomask comprises; a transparent substrate, a shielding pattern defining a light projector used to form a pattern on a wafer, formed on a front face of the transparent substrate, and a plurality of lattices that diffract light, formed on a back face of the transparent substrate. The plurality of lattices comprises binary lattices, where and each of the lattices has a duty ratio and a tilt angle used for controlling a phase and a transmittance of light.

The plurality of lattices is preferably formed by selectively etching the back face of the transparent substrate and a pitch of the plurality of lattices is preferably shorter than a wavelength of incident light used in an exposure process performed through the photomask.

A wafer shot uniformity is preferably controlled by controlling the duty ratio and the tilt angle of each of the plurality of lattices.

The plurality of lattices preferably forms multiphase diffraction optical elements and a transmittance of the multiphase diffraction optical elements is preferably controlled by controlling the duty ratio and the tilt angle of each of the plurality of lattices.

According to another aspect of the present invention a method of controlling transmittance and phase of light using lattices formed on a back face of a transparent substrate in a photomask is provided. The method comprises; selecting a transmittance and a phase in a predetermined region of the transparent substrate, determining a duty ratio and a tilt angle corresponding to the selected transmittance and phase, preparing the photomask by forming binary lattices having the duty ratio and the tilt angle on a predetermined region of the back face of the transparent substrate, and performing an exposure process using the photomask.

The binary lattices are preferably formed by selectively etching the back face of the transparent substrate.

A pitch of the binary lattices is preferably shorter than a wavelength of incident light used in the exposure process.

A wafer shot uniformity of the binary lattices is preferably controlled through the duty ratio and the tilt angle.

The binary lattices preferably form multiphase diffraction optical elements.

According to still another aspect of the present invention, a method of controlling transmittance and phase of light in an exposure process using a photomask is provided. The method comprises; transmitting the light through the photomask. The photomask comprises; a transparent substrate, a shielding pattern defining a light projector used to form a pattern on a wafer, formed on a front face of the transparent substrate, and a plurality of lattices that diffract light, formed on a back face of the transparent substrate. The plurality of lattices comprises binary lattices and each of the lattices has a duty ratio and a tilt angle for controlling a phase and a transmittance of light.

A pitch of the lattices is preferably shorter than a wavelength of incident light used in the exposure process and the plurality of lattices is preferably formed by selectively etching the back face of the transparent substrate.

A wafer shot uniformity is preferably controlled by controlling the duty ratio and the tilt angle of each of the plurality of lattices.

The plurality of lattices preferably forms multiphase diffraction optical elements and a transmittance of the multiphase diffraction optical elements is preferably controlled by controlling the duty ratio and the tilt angle of each of the plurality of lattices.

BRIEF DESCRIPTION OF THE DRAWINGS

The accompanying drawings illustrate several selected embodiments of the present invention and are incorporated in and constitute a part of this specification. In the drawings.

DETAILED DESCRIPTION OF THE INVENTION

Figure 1A:
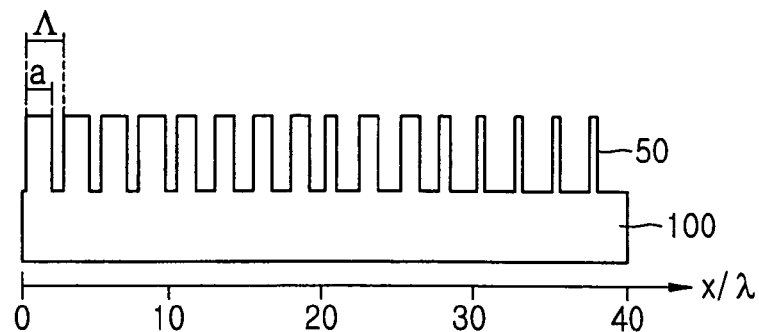
FIG. 1A is a cross-sectional view illustrating a lattice structure comprising lattices having different duty ratios.

The present invention will now be described more fully with reference to the accompanying drawings, in which several exemplary embodiments of the present invention are shown. In the drawings, the thickness of layers and regions is exaggerated for clarity. Throughout the drawings and the written description, like reference numerals are used to refer to like elements.

FIG. 1A is a cross-sectional view illustrating a lattice structure comprising lattices having different duty ratios. FIG. 1A is used to explain a principle related to the present invention.

Referring to FIG. 1A, a plurality of lattices 50 is formed by selectively etching the back face of transparent substrate 100 in order to form part of a photomask. A tilt angle for lattices 50 is 0°. In other words, all lattices are formed in a uniform direction.

Each of the lattices 50 is a binary lattice, i.e., the teeth and the corresponding adjacent spaces within lattices 50 have equal depths. A pitch "Λ" of lattice 50 is preferably shorter than a wavelength λ of light used in a photolithography process. For example, pitch Λ is typically λ/2 or λ/4.

Figure 1B:
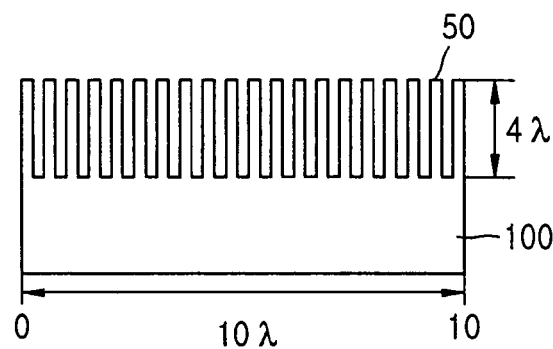
FIG. 1B is a magnified cross-sectional view of a portion of FIG. 1A.

Lattices 50 have different duty ratios in relation to one another. A duty ratio is defined as a ratio between a width "a" of a tooth and the pitch Λ of the lattice. In FIG. 1A, four lattices 50 having different respective duty ratios are depicted. The different duty ratios are 0.8, 0.6, 0.4, and 0.2. As shown in FIG. 1B, the span of a lattice having a uniform duty ratio is 10λ.

The lattice structure in FIG. 1A is arranged on an x/λ axis, where, x is a horizontal distance measured from one end of the photomask and λ is a wavelength of light used in a photolithography process. Lattices having a duty ratio of 0.8 are formed in a region spanning $0 \leq x/\lambda \leq 10$, lattices having a duty ratio of 0.6 are formed in a region spanning $10 \leq x/\lambda \leq 20$, lattices having a duty ratio of 0.4 are formed in a region spanning $20 \leq x/\lambda \leq 30$, and lattices having a duty ratio of 0.2 are formed in a region spanning $30 \leq x/\lambda \leq 40$. In other words, four lattices having decreasing duty ratios going from left to right, are formed on transparent substrate 100.

A plurality of shielding patterns (not shown) defining a light projector used for forming a pattern on a wafer are formed on a front face of transparent substrate 100.

FIG. 1B is a magnified cross-sectional view of a portion of FIG. 1A. In FIG. 1B, the lattice having the duty ratio of 0.8, i.e., the lattice formed in the region spanning $0 \leq x/\lambda \leq 10$ in FIG. 1A, is shown.

Referring to FIG. 1B, lattices 50 are very dense, pitch Λ is smaller than wavelength λ, and the depth of teeth and corresponding adjacent spaces in lattices 50 is approximately 4λ.

The present invention uses a diffraction phenomenon caused by the fact that lattices 50 have a pitch Λ shorter than wavelength λ. Diffraction in a lattice having a pitch Λ shorter than wavelength λ is different from ordinary scalar diffraction. Light transmitted through such a lattice has a phase determined by the duty ratio of the lattice. Accordingly, the phase is readily controlled by controlling the duty ratio of each of the lattices formed on the back face of the photomask.

Figure 2:
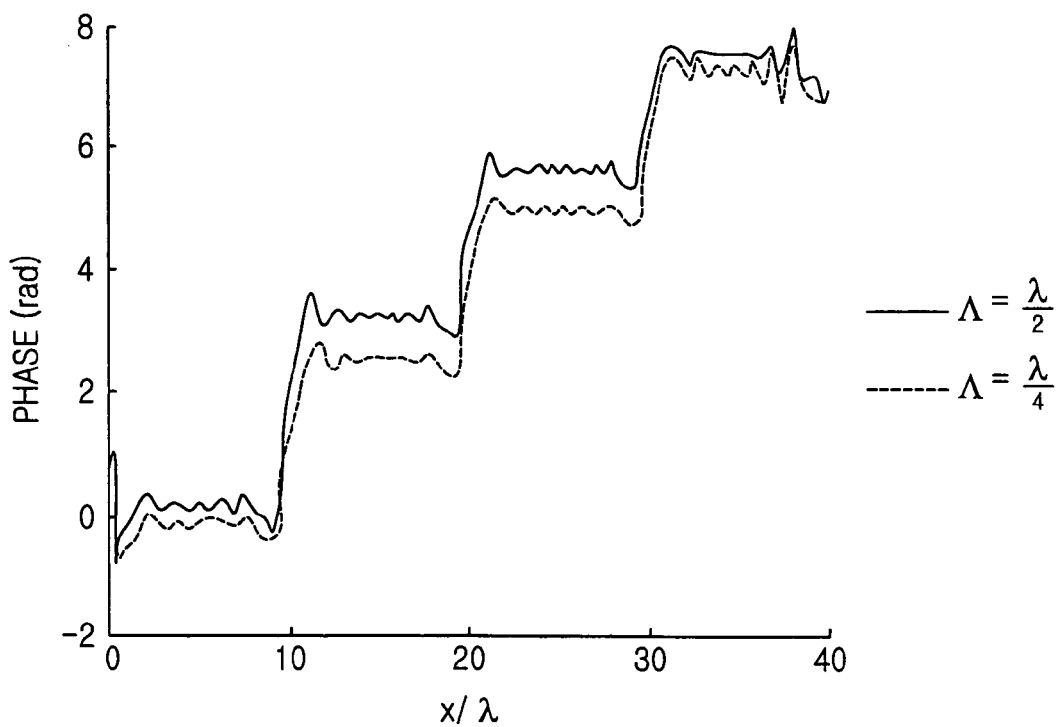
FIG. 2 is a graph illustrating phase variation for light transmitted through the lattices in FIG. 1A.

FIG. 2 is a graph illustrating phase variation according to the duty ratios of the lattices in FIG. 1A.

Referring to FIG. 2, the phase of light transmitted through the lattice structure is plotted as a function of location on the x/λ axis. Phase corresponding to a pitch Λ=λ/2 is indicated by a solid line, and phase corresponding to a pitch Λ=λ/4 is indicated by a dotted line. Phase varies in a stepwise fashion according to the different duty ratios in lattices 50. Within a lattice having a uniform duty ratio, only a small amount of phase variation exists, but in general, as the duty ratio increases, the phase tends to increase as well. Therefore, in a lattice structure where lattices have a uniform pitch shorter than a wavelength of incident light, the phase of light transmitted through the lattice structure changes significantly according to significant changes in the duty ratio of the lattices. Consequently, the phase of light transmitted through the photomask is readily controlled by varying the duty ratio.

Figure 3:
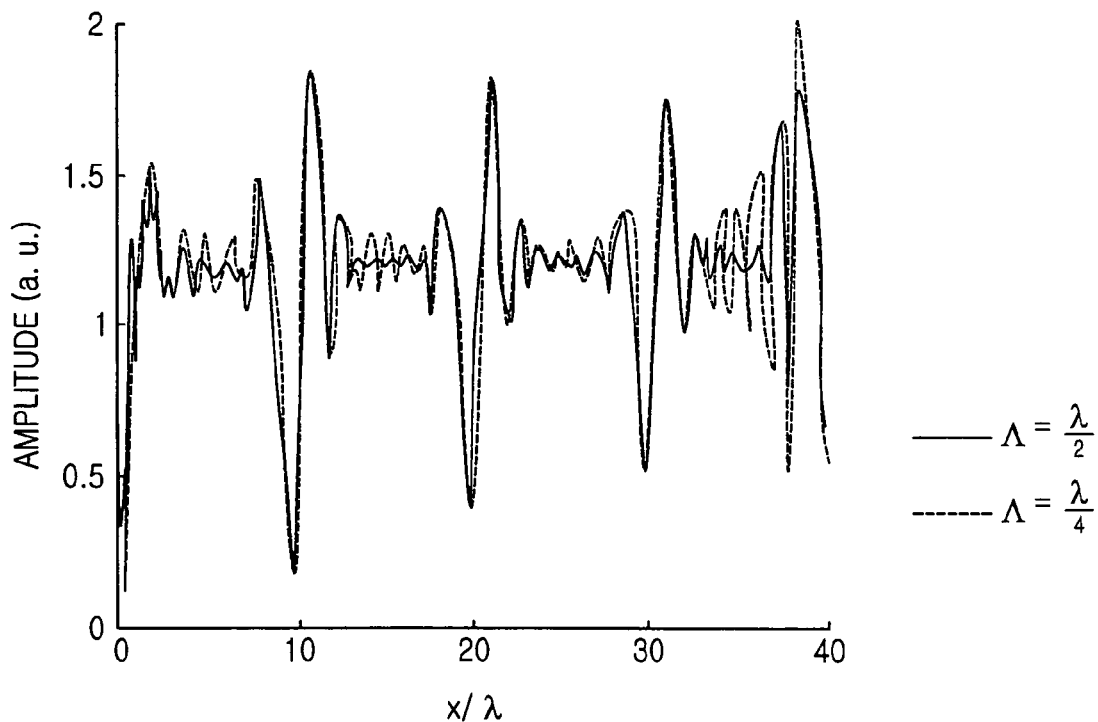
FIG. 3 is a graph illustrating amplitude variation for light transmitted through the lattices in FIG. 1A.

FIG. 3 is a graph showing an amplitude of light transmitted through the lattices in FIG. 1A as a function of distance along the x/λ axis.

Referring to FIG. 3, the amplitude varies by a small amount according to x/λ. The amplitude changes most significantly at the boundary line where duty ratio changes, but across the overall lattice structure, the amplitude remains relatively constant. This phenomenon is related to the tilt angle of lattices, which will be described later.

Figure 4A:
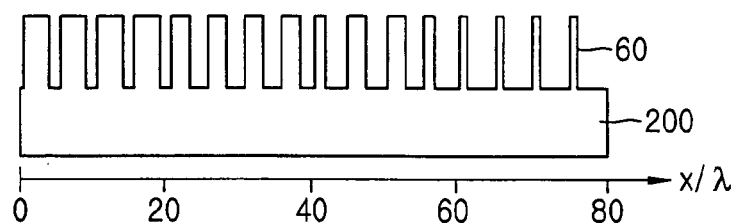
FIG. 4A is a cross-sectional view illustrating a lattice structure comprising lattices having different duty ratios; the lattice structure in FIG. 4A is longer than the lattice structure in FIG. 1A.

FIG. 4A is a cross-sectional view illustrating a lattice structure comprising lattices having different duty ratios. The lattice structure in FIG. 4A is longer than the lattice structure in FIG. 1A.

Referring to FIG. 4A, lattices 60 are formed by etching the back face of a transparent substrate 200 in order to form part of a photomask. Each of the lattices 60 has more teeth and corresponding adjacent spaces than each of the lattices 50 in FIG. 1A. In addition, a span associated with each of the lattices 60 has a uniform duty ratio of 20λ. Lattices 60 all have the same pitch, where the pitch is preferably shorter than λ/2 or λ/4. Lattices 60 having a duty ratio of 0.8 are formed in a region spanning 0≦x/λ≦20, lattices 60 having a duty ratio of 0.6 are formed in a region spanning 20≦x/λ≦40, lattices 60 having a duty ratio of 0.4 are formed in a region spanning 40≦x/λ≦60, and lattices 60 having a duty ratio of 0.2 are formed in a region spanning 60≦x/λ≦80. A tilt angle for the lattices 60 is 0°.

Figure 4B:
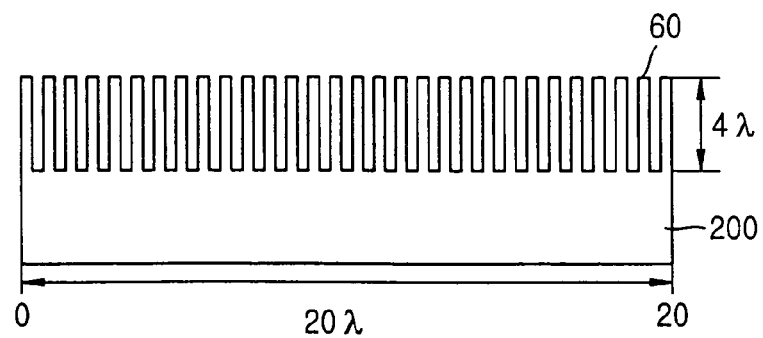
FIG. 4B is a magnified cross-sectional view of a portion of the lattices in FIG. 4A.

FIG. 4B is a magnified cross-sectional view of a portion of the lattices 60 in the region spanning 0≦x/λ≦20 in FIG. 4A. The teeth and corresponding adjacent spaces forming lattices 60 are densely formed, pitch Λ is smaller than wavelength λ, and the depth of the teeth and corresponding adjacent spaces in lattices 60 is approximately 4λ.

Figure 5:
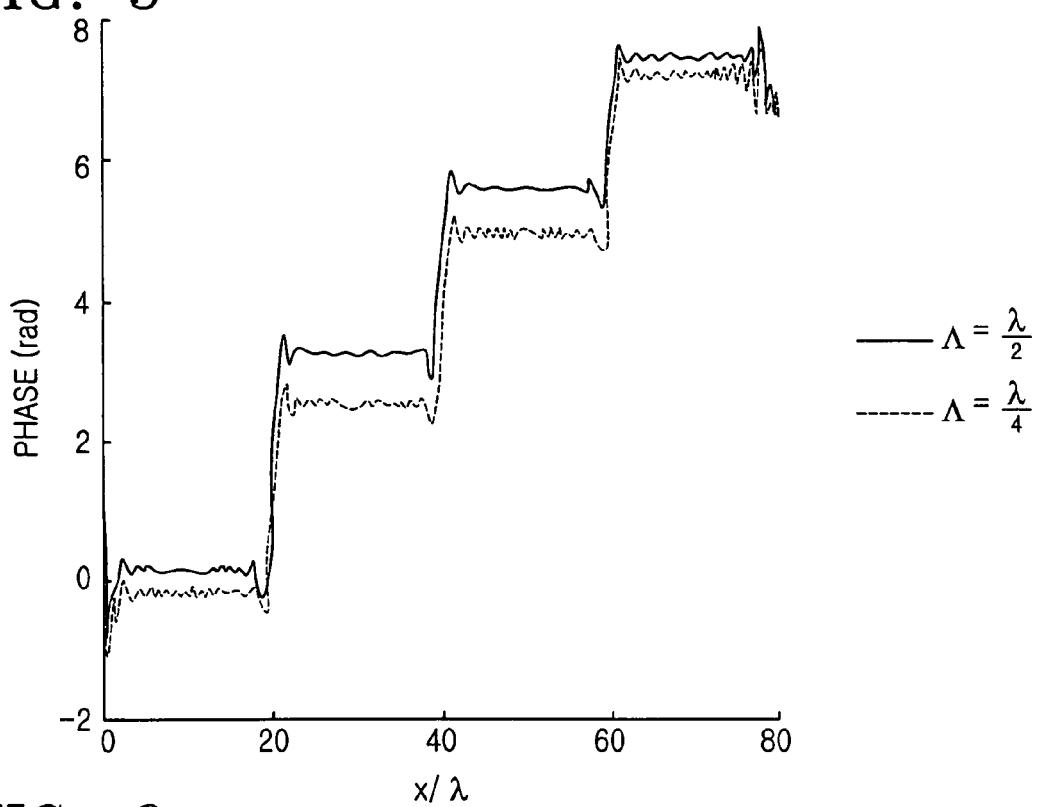
FIG. 5 is a graph showing phase variation for light transmitted through the lattices in FIG. 4A.

FIG. 5 is a graph illustrating how phase varies according to the duty ratio of the lattices in FIG. 4A.

Referring to FIG. 5, the phase of light transmitted through the lattice structure in FIG. 4A changes according to the duty ratio, showing a pattern of change similar to that shown in FIG. 2. Increasing the span of each of lattices 60 appears to have virtually no effect on the phase.

Figure 6:
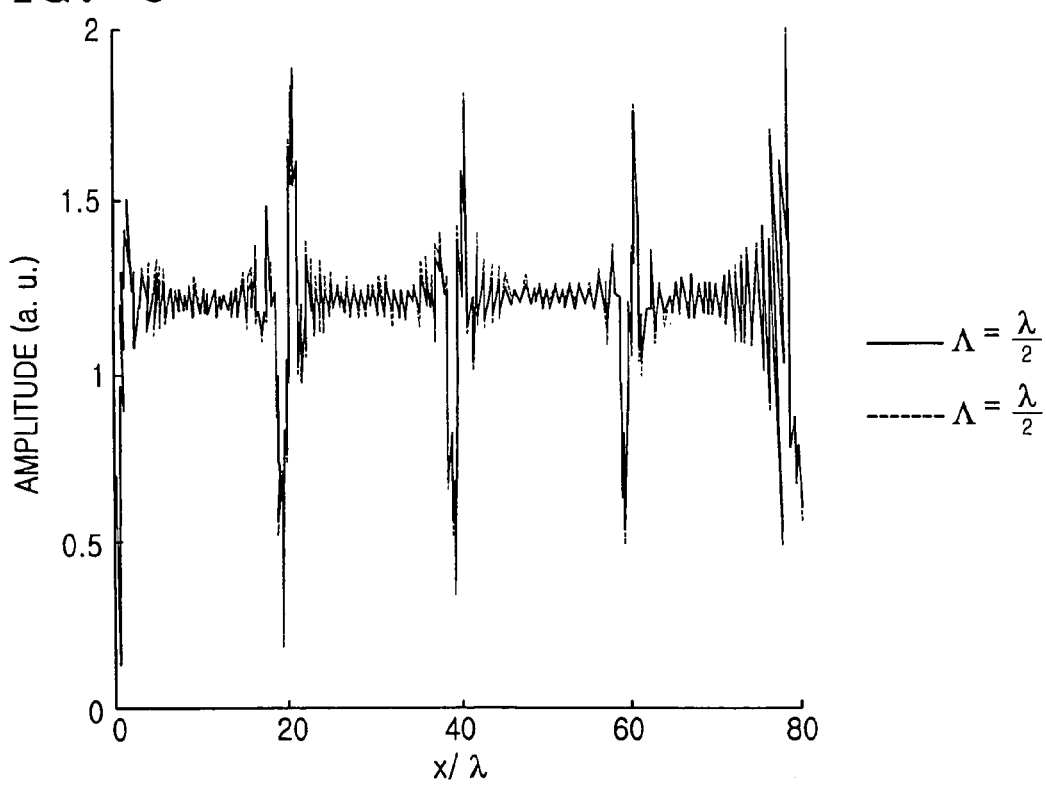
FIG. 6 is a graph showing amplitude variation for light transmitted through the lattices in FIG. 4A.

FIG. 6 is a graph showing amplitude of light transmitted through lattices 60 in FIG. 4A as a function of position on the x/λ axis.

Referring to FIG. 6, the amplitude varies by a small amount according to x/λ. The amplitude changes most significantly at the boundary line where duty ratio changes, but across the overall lattice structure, the amplitude remains relatively constant.

Next, a case will be described where the tilt angle for selected lattices varies from 0°.

Figure 7A:
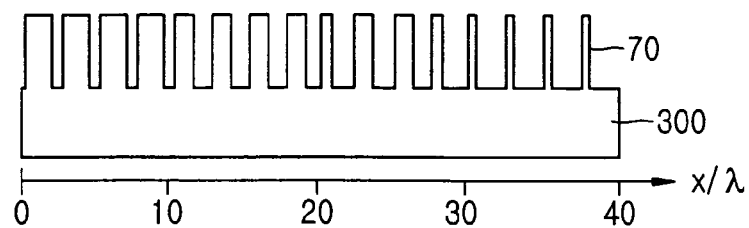
FIG. 7A is a cross-sectional view illustrating a lattice structure comprising lattices having different duty ratios; the lattices in FIG. 7A have a tilt angle of 45°.

FIG. 7A is a cross-sectional view illustrating a lattice structure comprising lattices having different duty ratios. The lattices in FIG. 7 have a tilt angle of 45°. The lattice structure has the same length as the lattice structure in FIG. 1A.

Referring to FIG. 7A, lattices 70 are formed on the back face of a transparent substrate 300. Lattices 70 are rotated by 45° relative to a standard direction. Varying the tilt angle affects the amplitude of light diffracted through the lattices, the intensity of light transmitted through the lattices, and the transmission coefficient of light.

Figure 7B:
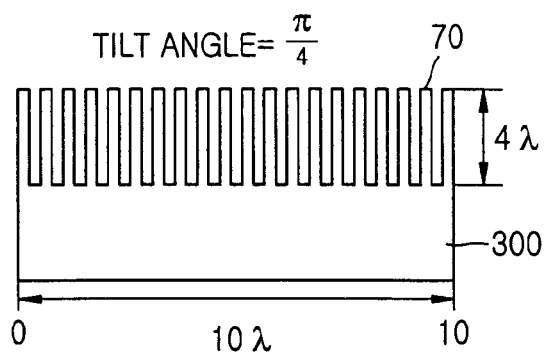
FIG. 7B is a magnified cross-sectional view of a portion of the lattices in FIG. 7A.

FIG. 7B is a magnified cross-sectional view of a region spanning 0≦x/λ≦10 in FIG. 7A.

The teeth and corresponding adjacent spaces forming lattices 70 are densely formed, pitch of lattices 70 is λ/2 or λ/4, the depth of the teeth and corresponding adjacent spaces is approximately 4λ, and the lattices have a tilt angle of 45°

$$\left(\frac{\pi}{4}\right).$$

Figure 8:
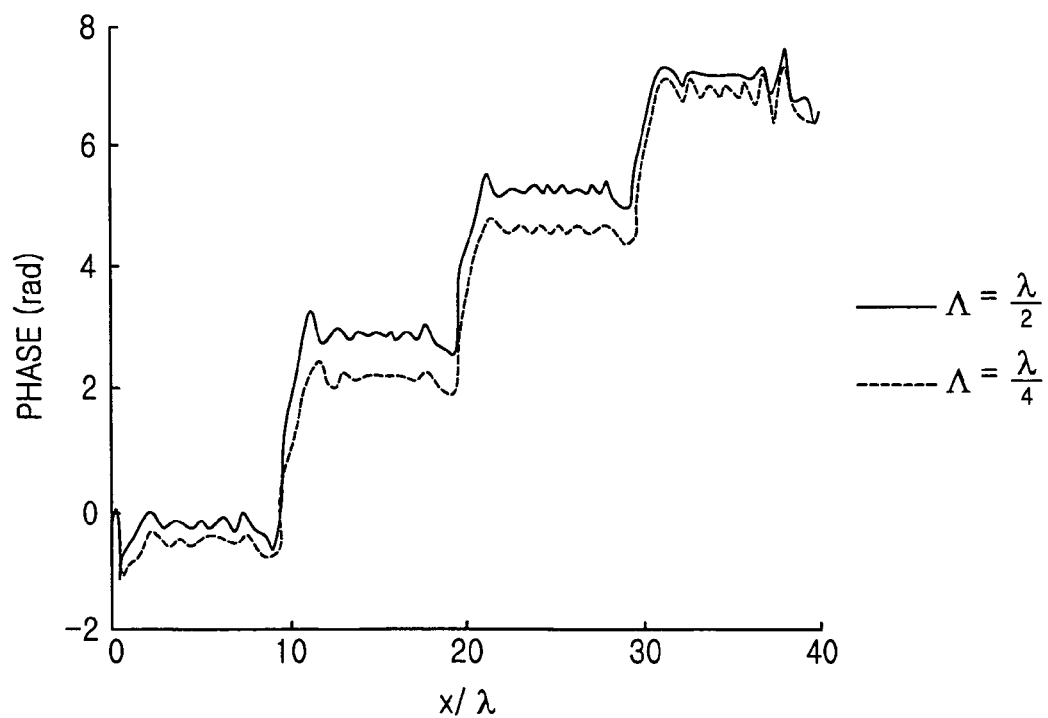
FIG. 8 is a graph showing phase variation for light transmitted through the lattices in FIG. 7A.

FIG. 8 is a graph showing how phase varies according to the duty ratio of lattices 70 in FIG. 7A.

Referring to FIG. 8, the phase of light transmitted through the lattice structure in FIG. 7A changes according to the duty ratio, showing a pattern of change similar to that shown in FIG. 2. Therefore, even where tilt angle is varied, phase is still controlled by the duty ratio.

Figure 9:
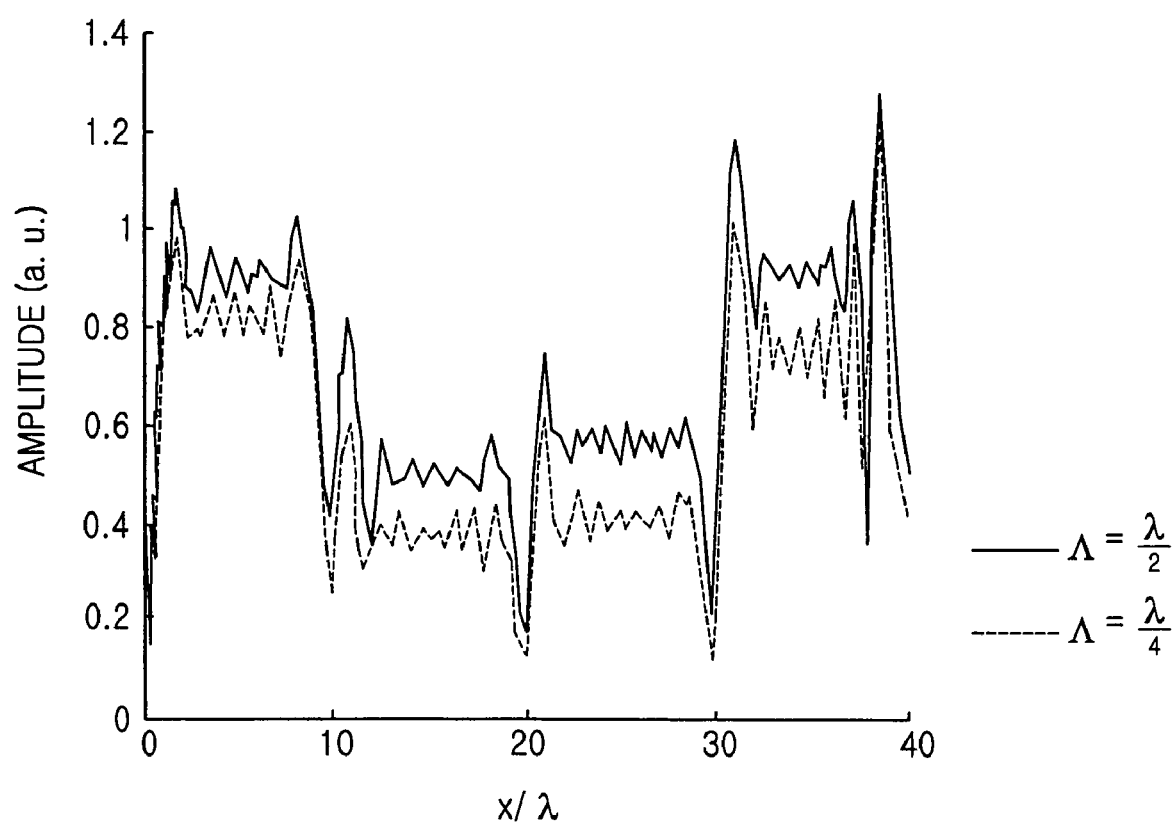
FIG. 9 is a graph showing amplitude variation for light transmitted through the lattices in FIG. 7A.

FIG. 9 is a graph showing the amplitude of light transmitted through lattices 70 as a function of distance on the x/λ axis in FIG. 7A.

Referring to FIG. 9, unlike the case in FIG. 3 where the tilt angle of the lattices is 0°, a large amplitude difference is seen in regions corresponding to different duty ratios. Accordingly, the amplitude of light transmitted through lattices 70 can be controlled by varying the tilt angle of lattices 70 with respect to a particular duty ratio.

As described above, a lattice structure comprising lattices having different duty ratios is formed on the back face of a transparent substrate constituting a part of a photomask. The phases of light transmitted through the transparent substrate are controlled by varying the duty ratios of the lattices. The amplitude of light transmitted through the lattices is controlled by varying the tilt angles of the lattices with respect to their particular duty ratios. Using these principles, the CD distribution is improved by controlling the transmittance of light through the photomask, and a multiphase diffraction optical element is formed on the back face of the photomask. The multiphase diffraction optical element provides a modified illumination effect by controlling the transmittance and phase of light.

Figure 10:
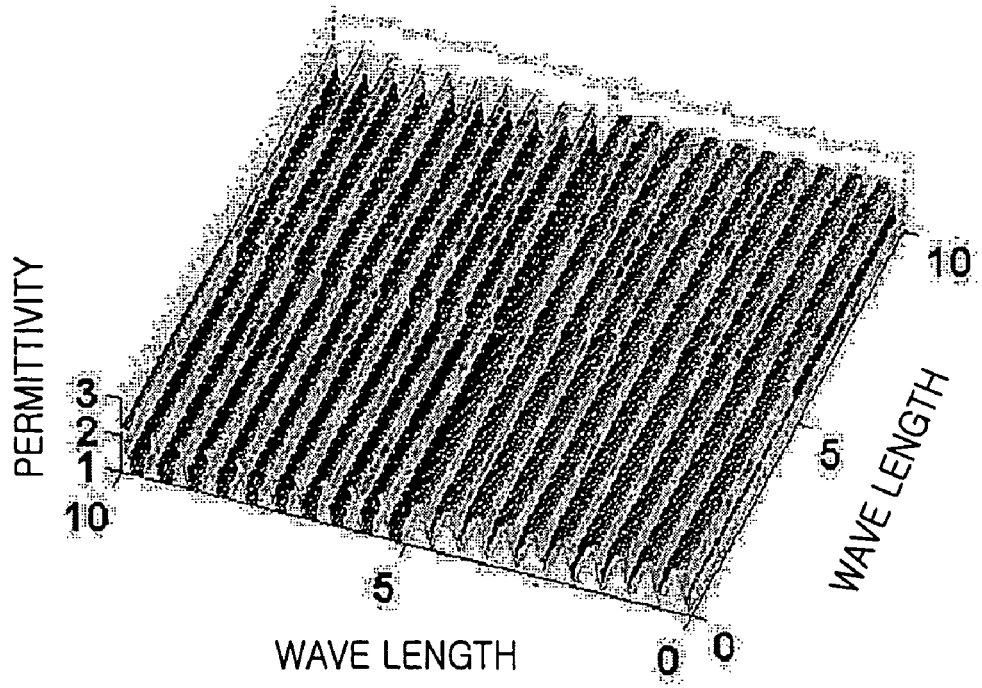
FIG. 10 is a perspective view illustrating a lattice structure formed on the back face of a photomask according to one embodiment of the present invention.

FIG. 10 is a perspective view illustrating a lattice structure formed on the back face of a photomask according to one embodiment of the present invention.

Referring to FIG. 10, four lattices having different duty ratios are formed. The x and y axes correspond to distances measured in wavelengths λ, which is the wavelength of light transmitted through the lattice structure. The z-axis corresponds to permittivity, which is related to the refractive index of the transparent substrate. Because of the refractive index of the transparent substrate, the permittivity in FIG. 10 roughly corresponds to the height of the teeth and corresponding adjacent spaces in the lattice structure. Depths of the teeth and corresponding adjacent spaces are equal to each other, and therefore, the lattices are binary lattices. A width and length for each of the lattices having the four different duty ratios is 5λ. A pitch Λ is preferably the same for all lattices and shorter wavelength λ. Also, all lattices preferably have the same tilt angle.

Figure 11:
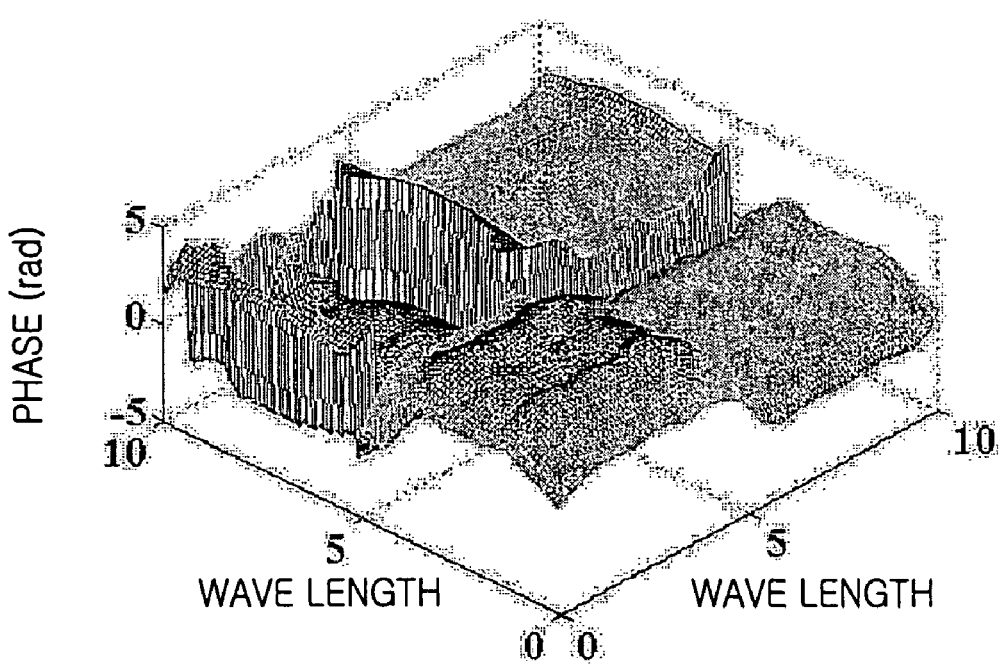
FIG. 11 is a three-dimensional graph illustrating a phase distribution for light transmitted through the lattice structure in FIG. 10.

FIG. 11 is a three dimensional graph illustrating a phase distribution for light transmitted through the lattice structure in FIG. 10.

Referring to FIG. 11, the lattices have different phases according to their different duty ratios. Because each lattice has a uniform duty ratio, there is minimal variation in phase within the lattices. However, there is considerable phase variation between lattices having different duty ratios. Accordingly, a desired phase can be obtained in a location in a particular location of the photomask by controlling the duty ratio for the lattice formed at that location.

Figure 12:
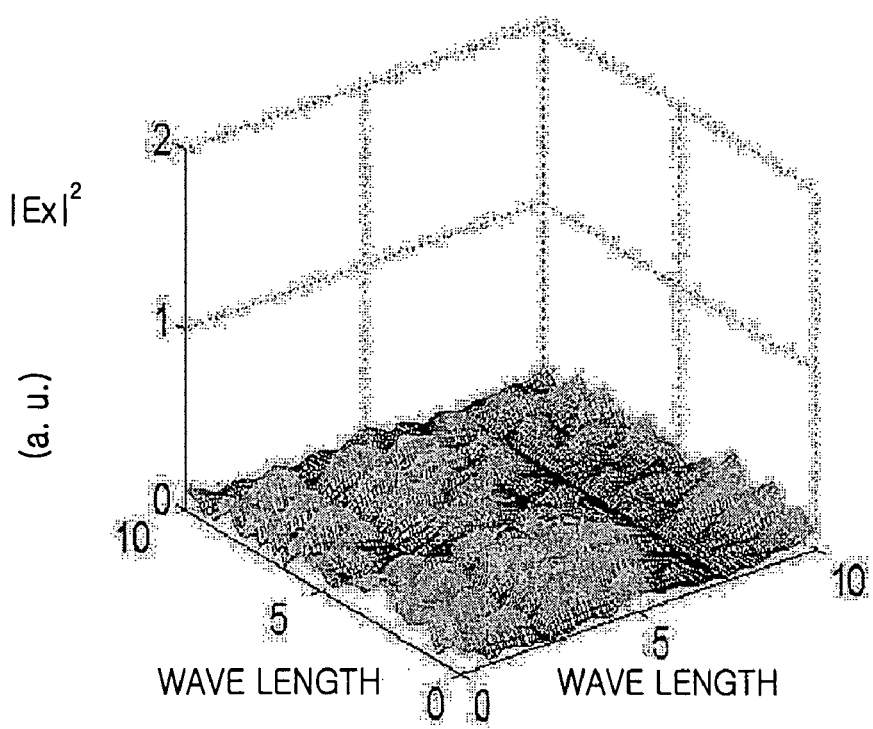
FIG. 12 is a three-dimensional graph illustrating an intensity distribution for light transmitted through the lattice structure in FIG. 10.

FIG. 12 is a three dimensional graph illustrating an intensity distribution for light transmitted through the lattice structure in FIG. 10.

Referring to FIG. 12, the intensity of light transmitted throughout the lattice structure is virtually uniform. Since the intensity of light is proportional to the square of the amplitude of the light and the amplitude is determined by the transmittance of the lattice structure, the intensity of light depicted in FIG. 12 is determined by the transmittance of the lattice structure. As seen in FIG. 12, the intensity of light transmitted through the lattice structure is nearly uniform despite variation in the duty ratio where the tilt angle of all lattices is 0°.

Figure 13:
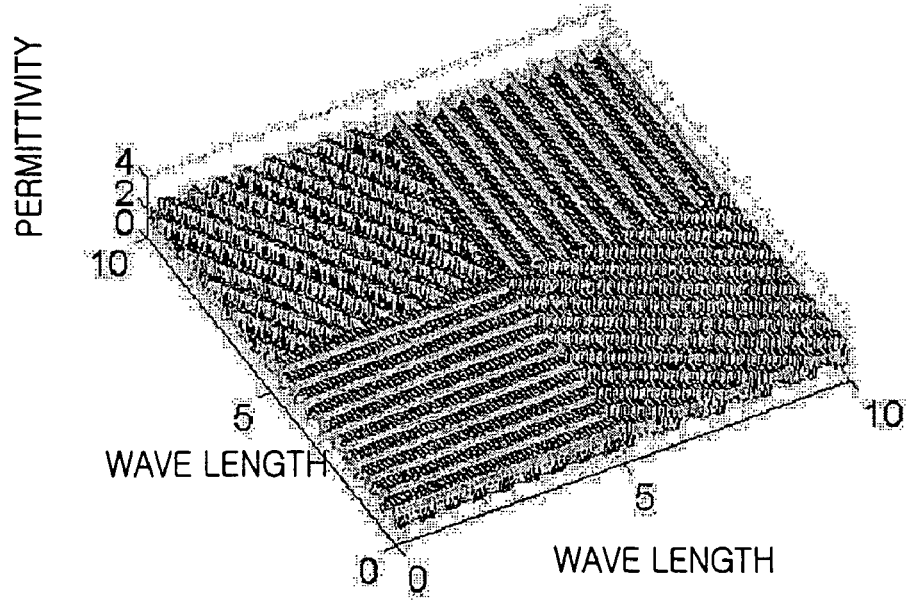
FIG. 13 is a perspective view of a lattice structure formed on the back face of a photomask according to another embodiment of the present invention.

FIG. 13 is a perspective view of a lattice structure comprising lattices having different duty ratios formed on the back face of a photomask according to another embodiment of the present invention.

Referring to FIG. 13, the depths of the teeth and corresponding adjacent spaces constituting the lattice structure are the same. Hence, the lattice structure is a binary lattice structure. The pitches Λ of the lattices are preferably identical and shorter than a wavelength λ of light transmitted through the lattice structure. In the lattice structure shown in FIG. 13, the tilt angles for the lattices corresponding to the different duty ratios are set in different directions.

Figure 14:
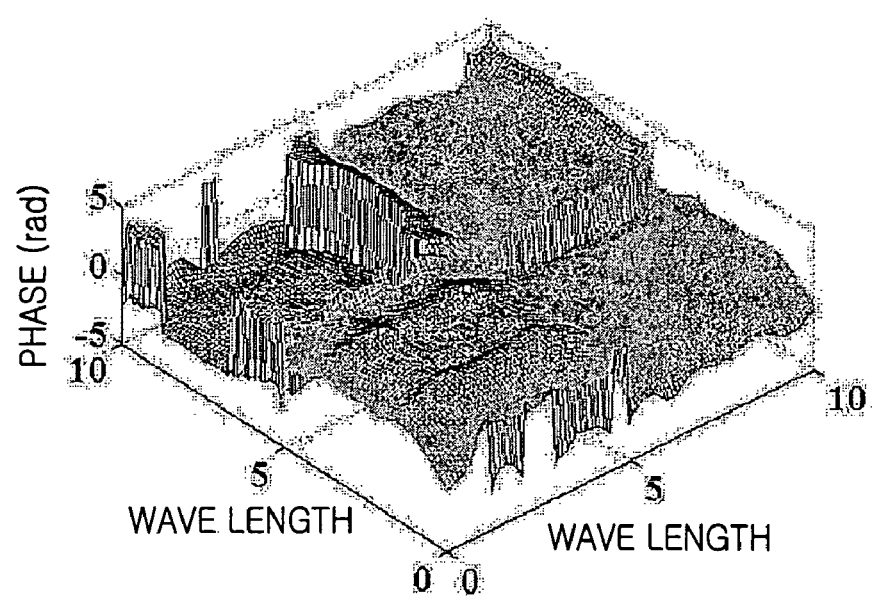
FIG. 14 is a three-dimensional graph illustrating a phase distribution for light transmitted through the lattice structure in FIG. 13.

FIG. 14 is a three-dimensional graph illustrating a phase distribution for light transmitted through the lattice structure in FIG. 13.

Referring to FIG. 14, the lattices in the lattice structure have different phases corresponding to their different duty ratios. Changing the tilt angles has a minimal effect on the phases, as seen by comparing FIG. 14 to FIG. 11. Accordingly, a desired phase is obtained in a desired location of the photomask by varying the duty ratios of the lattices.

Figure 15:
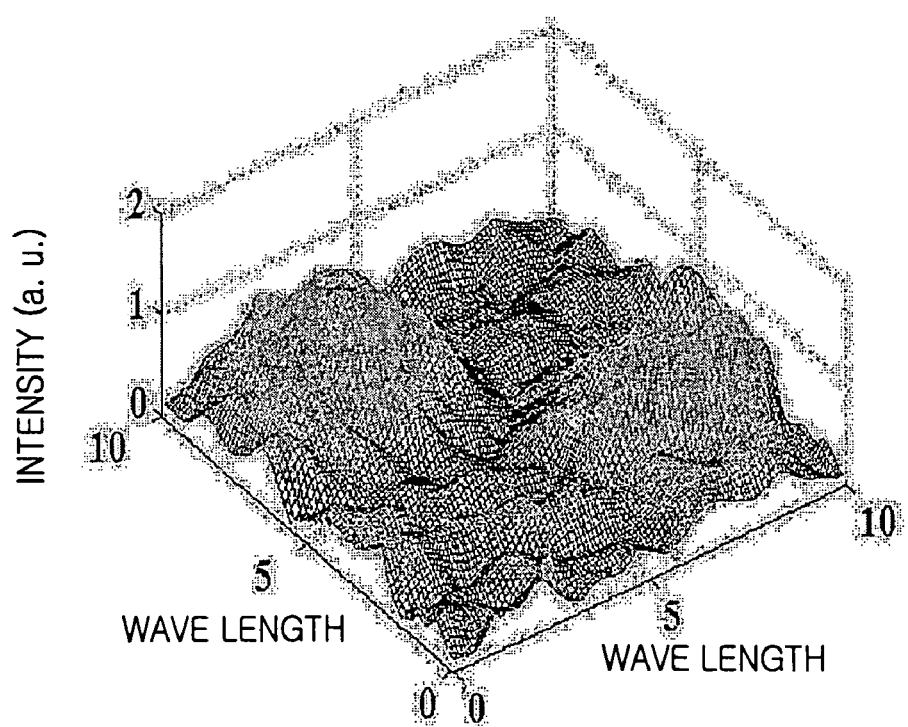
FIG. 15 is a three-dimensional graph illustrating an intensity distribution for light transmitted through the lattice structure in FIG. 13.

FIG. 15 is a three dimensional graph illustrating an intensity distribution for light transmitted through the lattice structure in FIG. 13.

Referring to FIG. 15, the light intensity distribution is significantly different from the light intensity distribution for light transmitted through a lattice structure where the tilt angles of the lattice are all 0°. This is due to the fact that the tilt angle of a lattice having a particular duty ratio plays a significant role in determining the intensity or transmittance of light through the lattice structure. Therefore, the transmittance of light through the lattice structure can be controlled by controlling the tilt angle together with the duty ratio. Using this method to control the transmittance, a delta CD distribution phenomenon occurring at a step difference of a photomask can be effectively compensated.

As described with reference to FIGS. 10 through 15, the phase and intensity of light transmitted through a lattice structure is controlled by controlling the duty ratio and tilt angle for lattices formed on a back face of a transparent substrate of a photomask. However, for a given phase, only a limited transmittance range can be controlled. The controllable transmittance range is constrained by the range of duty ratios and tilt angles satisfying the constraint that a pitch Λ should be shorter than a wavelength λ of light transmitted through the lattice structure. As a result, a transmittance between 0 and 1 cannot be obtained with respect to a particular phase value. However, the duty ratio and the tilt angle can be controlled to have a phase value anywhere between 0 and 2π (rad).

Figure 16:
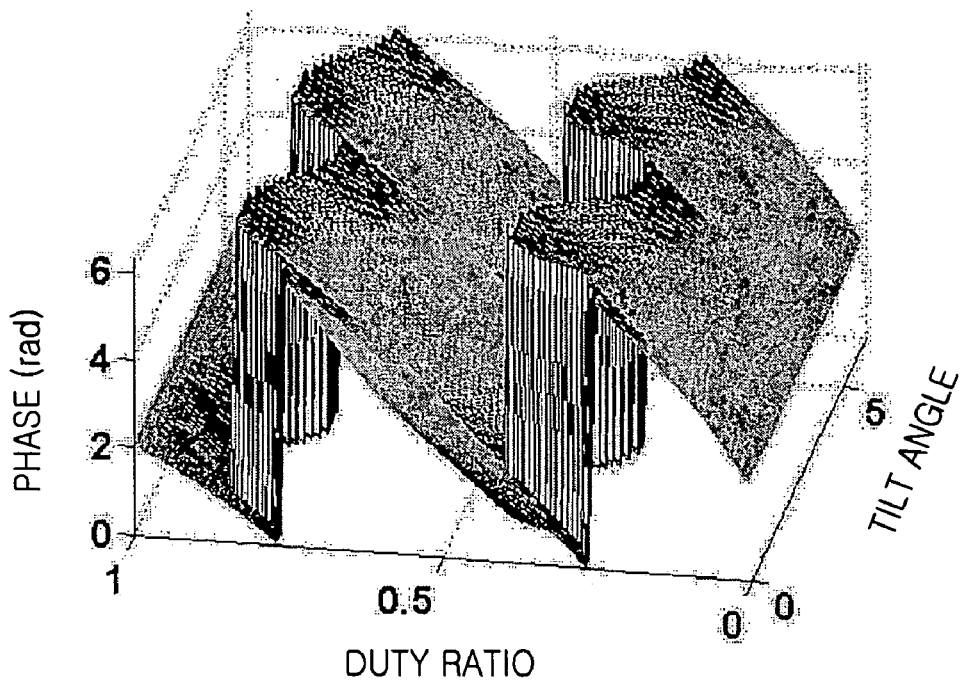
FIG. 16 is a three-dimensional graph illustrating phase variation for light according to a duty ratio and a tilt angle of the lattices.

FIG. 16 is a three-dimensional graph showing how the phase of light transmitted through a lattice varies according to duty ratio and tilt angle of the lattice.

Referring to FIG. 16, a particular phase value is determined by the combination of the duty ratio and the tilt angle. The phase value varies periodically according to the duty ratio and the tilt angle of the lattice. Therefore, a desired phase is achieved by controlling the duty ratio and tilt angle of the lattice.

Figure 17:
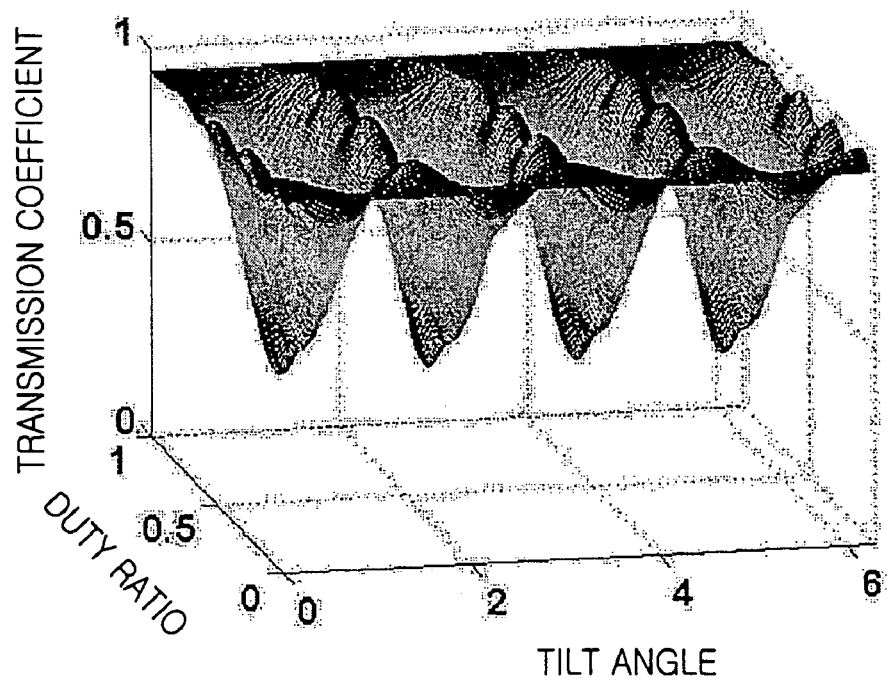
FIG. 17 is a three-dimensional graph illustrating a transmittance variation according to a duty ratio and a tilt angle of the lattices.

FIG. 17 is a three-dimensional graph illustrating how transmittance of light through a lattice varies according to duty ratio and tilt angle of the lattice.

Referring to FIG. 17, transmittance of light through a lattice is determined by a combination of the duty ratio and the tilt angle of the lattice. The transmittance of light varies periodically according to the duty ratio and the tilt angle of the lattice. Therefore, a desired transmittance is achieved by controlling the duty ratio and the tilt angle of the lattice.

According to FIGS. 16 and 17, transmittance can be modified while keeping the phase constant by fixing a duty ratio for which the phase does not change and then modifying the tilt angle of the lattice. Alternatively, phase can be modified while keeping the transmittance constant by fixing a tilt angle for which the transmittance does not change and then modifying the duty ratio of the lattice. There are, however, transmittance and phase ranges for which the transmittance and the phase cannot be controlled by controlling the duty ratio and the tilt angle.

According to FIGS. 16 and 17, transmittance and phase at a particular location of a transparent substrate are readily controlled. This is done by selecting a desired value of transmittance and phase in a predetermined region of the transparent substrate and then determining a duty ratio and a tilt angle corresponding to the selected transmittance and phase using FIGS. 16 and 17. A photomask having predetermined transmittance and phase is prepared by forming binary lattices having the duty ratio and the tilt angle determined from FIGS. 16 and 17 on a predetermined region of a back face of a transparent substrate. The transmittance and phase of light transmitted through the photomask are controlled to a desired value by performing an exposure process using the photomask.

Figure 18:
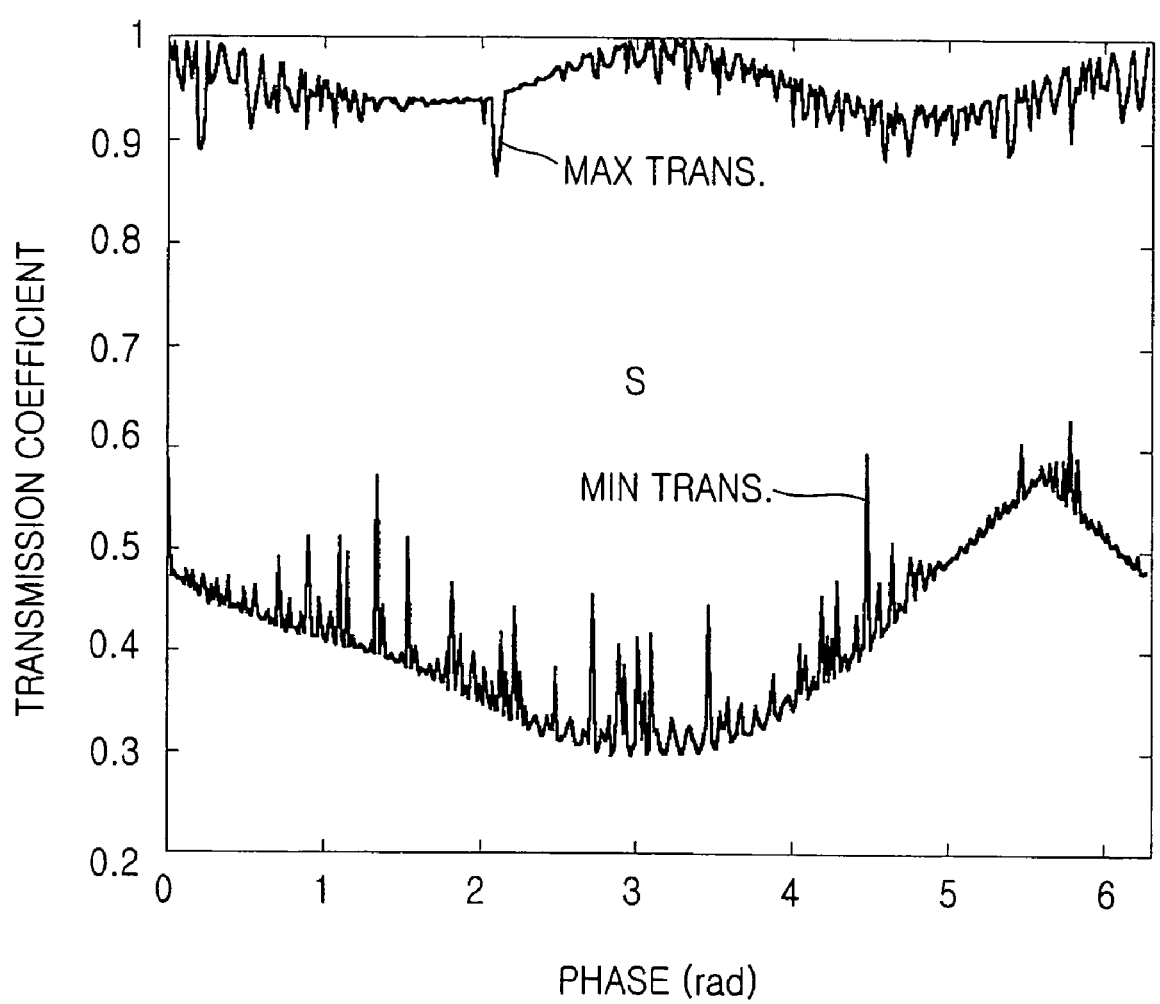
FIG. 18 is a graph showing a controllable range for transmittance and phase of light according to the present invention.

FIG. 18 is a graph showing a controllable range of transmittance and phase according to the present invention.

Referring to FIG. 18, maximum and minimum attainable transmittances are defined for each phase. Accordingly, a limited transmittance range can be attained for each particular phase. In other words, a combination of transmittance and phase can be achieved in a region "S" in FIG. 18 between the maximum transmittance curve and the minimum transmittance curve by controlling the duty ratio and the tilt angle according to the present invention. Using a photomask according to the present invention, a phase and transmittance combination can be selected in region "S".

Therefore, to obtain a particular transmittance and phase within region "S", a duty ratio and a tilt angle corresponding to the particular transmittance and phase are selected from FIGS. 16 and 17. Lattices are then formed on a transparent substrate constituting a part of a photomask according to the selected duty ratio and tilt angle. A desired transmittance and phase are obtained by transmitting light through the photomask on which the lattices are formed. Light having multiple phase values is obtained from a single photomask by varying the duty ratios and tilt angles of different lattices within the photomask according to their locations on the back face of the transparent substrate.

According to the present invention, a multiphase diffraction optical element is formed using binary lattices. Where such a multiphase diffraction optical element is used to obtain a modified illumination effect, a higher efficiency image is obtained compared to an image obtained by using a binary phase diffraction optical element. Hence, the photomask of the present invention is used to form a variety of complicated patterns on a wafer at a high resolution.

In addition, the modified illumination effect provided by the present invention is used to form a pattern between a cell region of a dynamic random access memory (DRAM) and a peripheral circuit region (or core region), since the pattern can be obtained using only binary lattices. By employing the present invention, diffraction efficiency is increased and noise components are removed by controlling transmittance.

The present invention is also advantageous in manufacturing a photomask. For example, when manufacturing a vortex mask for forming a contact hole, a continuous phase realization is necessary. However, due to manufacturing difficultness, conventionally formed by dividing the phase into four steps. Accordingly, the back face of the transparent substrate is patterned an increased number of times, which increases the time and cost of manufacturing the photomask. In the present invention, a lattice structure capable of realizing phases having many steps is readily formed through a single etching of the transparent substrate. Additionally, CD control is accomplished by compensating for a delta CD variation appearing at a step difference of a photomask by controlling the phase and the transmittance simultaneously. Additionally, the present invention provides control of transmittance for improving a wafer shot uniformity.

According to the present invention, a desired phase and transmittance are obtained by controlling duty ratios and tilt angles of lattices formed on a back face of a transparent substrate constituting a part of a photomask. The photomask of the present invention provides an improved CD distribution and a modified illumination effect. It also makes it possible for increasingly complicated and minute patterns to be correctly and effectively formed on a wafer.

According to the present invention, since a multiphase diffraction optical element is formed using only a binary lattice structure, a phase having many steps can be realized by a single etching of a transparent substrate. Accordingly, a manufacturing process used to form a back face of a transparent substrate constituting a part of the photomask is simplified, thereby increasing productivity and reducing manufacturing cost.

The preferred embodiments disclosed in the drawings and the corresponding written description are teaching examples. Those of ordinary skill in the art will understand that various changes in form and details may be made to the exemplary embodiments without departing from the scope of the present invention as defined by the following claims.

What is claimed is:

1. A photomask, comprising:
    a transparent substrate having a front face and a back face; and,
    a lattice structure diffracting light and formed on the back face of the transparent substrate, wherein the lattice structure comprises binary lattices, each of the binary lattices having a duty ratio and a tilt angle controlling phase and transmittance for the diffracted light.

2. The photomask of claim 1, wherein the lattice structure is formed by selectively etching the back face of the transparent substrate.

3. The photomask of claim 1, wherein a pitch of the binary lattices is shorter than a wavelength of incident light applied to the photomask.

4. The photomask of claim 1, wherein the respective duty ratio and tilt angle for each of the binary lattices define an exposure uniformity for the photomask.

5. The photomask of claim 1, wherein the binary lattices form multiphase diffraction optical elements.

6. The photomask of claim 5, wherein transmittance for the multiphase diffraction optical elements is controlled by controlling the duty ratios and the tilt angles of the binary lattices.

7. The photomask of claim 1, further comprising:
    a shielding pattern formed on the front face of the transparent substrate and defining a light projector used to form a pattern on a wafer.

8. The photomask of claim 7, wherein a pitch of the binary lattices is shorter than a wavelength of incident light applied to the photomask.

9. The photomask of claim 7, wherein the binary lattices form multiphase diffraction optical elements.

10. The photomask of claim 9, wherein transmittance for the multiphase diffraction optical elements is controlled by controlling the duty ratios and the tilt angles of the binary lattices.

11. A method of controlling transmittance and phase of light with a photomask, wherein the photomask comprises a transparent substrate, the method comprising:
    selecting a transmittance and a phase for light transmitted through a predetermined region of the transparent substrate;
    determining a duty ratio and a tilt angle corresponding to the selected transmittance and phase;
    preparing the photomask by forming binary lattices having the duty ratio and the tilt angle on the predetermined region of the transparent substrate; and,
    exposing light through the photomask.

12. The method of claim 11, wherein preparing the photomask further comprises:
    forming the binary lattices by selectively etching a back face of the transparent substrate.

13. The method of claim 11, wherein exposing light through the photomask comprises performing a wafer shot having a uniformity related to the binary lattices as controlled by the duty ratio and the tilt angle.

14. The method of claim 11, wherein the binary lattices form multiphase diffraction optical elements.

15. A method of controlling transmittance and phase of light in an exposure process, the method comprising:
    providing a photomask, wherein the photomask comprises:
        a transparent substrate having a front face and a back face; and,
        a lattice structure formed on the back face of the transparent substrate and diffracting light;
        wherein the lattice structure comprises binary lattices, each of the binary lattices having a duty ratio and a tilt angle controlling phase and transmittance of the diffracted light; and,
    applying incident light through the photomask.

16. The method of claim 15, wherein a pitch of the binary lattices is shorter than a wavelength of the incident light.

17. The method of claim 15, wherein applying incident light through the photomask comprises performing a wafer shot having a uniformity controlled by the duty ratios and the tilt angles of the binary lattices.

18. The method of claim 15, wherein the binary lattices form multiphase diffraction optical elements.

19. The method of claim 18, wherein transmittance of the multiphase diffraction optical elements is controlled by controlling the duty ratios and the tilt angles of the binary lattices.

* * * * *